(12) United States Patent
Jin et al.

(10) Patent No.: US 12,520,677 B2
(45) Date of Patent: Jan. 6, 2026

(54) ARRAY SUBSTRATE, DISPLAY PANEL, AND METHOD OF MANUFACTURING ARRAY SUBSTRATE

(71) Applicant: HKC CORPORATION LIMITED, Shenzhen (CN)

(72) Inventors: Lu Jin, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 443 days.

(21) Appl. No.: 18/012,629

(22) PCT Filed: Dec. 31, 2021

(86) PCT No.: PCT/CN2021/143538
§ 371 (c)(1),
(2) Date: Dec. 22, 2022

(87) PCT Pub. No.: WO2023/040128
PCT Pub. Date: Mar. 23, 2023

(65) Prior Publication Data
US 2025/0107356 A1 Mar. 27, 2025

(30) Foreign Application Priority Data
Sep. 15, 2021 (CN) .......................... 202111077851.2

(51) Int. Cl.
*H10K 59/126* (2023.01)
*H10K 59/12* (2023.01)
(Continued)

(52) U.S. Cl.
CPC ........ *H10K 59/126* (2023.02); *H10K 59/1201* (2023.02); *H10K 59/124* (2023.02); *H10K 50/13* (2023.02)

(58) Field of Classification Search
CPC ............. H10K 59/126; H10K 59/1201; H10K 59/124; H10K 50/13
(Continued)

(56) References Cited

U.S. PATENT DOCUMENTS

2002/0071073 A1 6/2002 Sekine et al.
2005/0275038 A1* 12/2005 Shih .................. H10D 30/6755
257/382

(Continued)

FOREIGN PATENT DOCUMENTS

| CN | 101017298 A | 8/2007 |
| CN | 110265412 A | 9/2019 |

(Continued)

*Primary Examiner* — Dzung Tran

(57) ABSTRACT

An array substrate, a display panel and a method of manufacturing an array substrate are disclosed. The array substrate includes: a base substrate and a thin film transistor layer disposed on the base substrate. The thin film transistor layer includes an active layer, and further includes a shielding layer that is disposed between the base substrate and the thin film transistor layer and that defines a groove, where the active layer at least partially extends into the groove. In the present application, the problem of leakage current caused by the active layer being exposed to light is improved by the above solution.

13 Claims, 8 Drawing Sheets

(51) Int. Cl.
*H10K 59/124* (2023.01)
*H10K 50/13* (2023.01)

(58) Field of Classification Search
USPC .......................................................... 257/40
See application file for complete search history.

(56) References Cited

U.S. PATENT DOCUMENTS

| | | | |
|---|---|---|---|
| 2007/0182874 A1* | 8/2007 | Kamijima | G09G 3/3611 349/44 |
| 2016/0141425 A1* | 5/2016 | Sun | H10D 30/6729 257/66 |
| 2019/0207037 A1* | 7/2019 | Wang | H01L 21/28114 |
| 2021/0020721 A1* | 1/2021 | Kwack | H10K 59/122 |
| 2021/0091123 A1* | 3/2021 | Ren | H10D 86/441 |
| 2021/0226067 A1* | 7/2021 | Wang | H10D 99/00 |

FOREIGN PATENT DOCUMENTS

| | | |
|---|---|---|
| CN | 111223876 A | 6/2020 |
| CN | 113066818 A | 7/2021 |
| CN | 113284945 A | 8/2021 |
| CN | 113540131 A | 10/2021 |
| JP | 2004271903 A | 9/2004 |

\* cited by examiner

ARRAY SUBSTRATE, DISPLAY PANEL, AND METHOD OF MANUFACTURING ARRAY SUBSTRATE

This application is a United States national stage application of co-pending International Patent Application Number PCT/CN2021/143538, filed Dec. 31, 2021, which claims the benefit and priority of Chinese patent application number CN202111077851.2, entitled "Array Substrate, Display Panel, and Method of Manufacturing Array Substrate" and filed with China National Intellectual Property Administration on Sep. 15, 2021, the entire contents of which are incorporated herein by reference.

TECHNICAL FIELD

This application relates to the field of display technology, and more particularly relates to an array substrate, a display panel and a method of manufacturing an array substrate.

BACKGROUND

The statements herein are intended for the mere purpose of providing background information related to the present application and do not necessarily constitute prior art.

Nowadays, both a liquid crystal display panel (LCD) and an organic light emitting diode display panel (OLED) each have an array substrate on which a thin film transistor (TFT) is disposed.

In a thin film transistor, the active layer is a very important layer, which determines the performance of the thin film transistor to a large extent, and many active layers have the problem of leakage current when exposed to light, which will lead to unstable performance the thin film transistor. In order to solve this technical problem in the related art, a shielding layer is arranged below the active layer, but the effect of the shielding layer is limited, so that the performance of the thin film transistor is still unstable.

SUMMARY

In view of the above, it is a purpose of the present application to provide an array substrate, a display panel and a method of manufacturing the array substrate, so as to improve the phenomenon of unstable performance of the active layer of the thin film transistor of the existing array substrate when exposed to light.

The present application discloses an array substrate, including a base substrate and a thin film transistor layer disposed on the base substrate. The thin film transistor layer includes an active layer. The array substrate further includes a shielding layer arranged between the base substrate and the thin film transistor layer. The shielding layer includes a groove, and the active layer at least partially extends into the groove.

The present application further discloses a display panel including an array substrate and a printed circuit board, wherein the printed circuit board is bound and connected to the array substrate, where the array substrate adopts any one of the array substrates disclosed in the present application.

The present application further discloses a method for manufacturing an array substrate, the method being used to manufacture any one of the array substrates disclosed in the present application and including the following operations:

disposing a base substrate, performing a deposition and etching process on the base substrate to form a shielding layer, wherein the shielding layer includes a groove;

forming the thin film transistor layer on the shielding layer, where the formed active layer of the thin film transistor layer at least partially extends into the groove.

Compared with the display panels in the related art, in which the active layer is exposed to light to produce leakage current resulting in poor stability of the thin film transistor, the present application proposes a design where a groove is defined in the shielding layer and the active layer at least partially extends into the groove so that the upper surfaces of the two sides of the shielding layer are higher than the lower surface of at least a part of the active layer, thus creating a semi-enclosed structure around the active layer. In this way, the shielding layer can shield the active layer from the bottom and sides. That is, the shielding layer can not only block the light from below the shielding layer, but also can well block the light incident from the sides from irradiating the active layer. Thus, an excellent light-shielding effect is achieved by a single shielding layer, which avoids the problem of leakage current caused by the active layer of the thin-film transistor exposed to light, thus improving the operating stability of the thin-film transistor, and improving the display effect.

DETAILED DESCRIPTION OF EMBODIMENTS

The present application will be described in detail below with reference to the accompanying drawings and optional embodiments.

The present application discloses an array substrate, including a base substrate and a thin film transistor layer disposed on the base substrate. The thin film transistor layer includes an active layer. The array substrate further includes a shielding layer arranged between the base substrate and the thin film transistor layer. The shielding layer includes a groove, and the active layer at least partially extends into the groove. An orthographic projection of the shielding layer onto the base substrate completely covers an orthographic projection of the active layer onto the base substrate, and a height of an upper surface of at least a part of the shielding layer is higher than a height of a lower surface of a part of the active layer.

Compared with the solution in which the active layer in the display panel is exposed to light to produce a leakage current, which leads to poor stability of the thin film transistor, the present application proposes the design where the shielding layer defines a groove, and the active layer at least partially extends into the groove, so that the upper surfaces on both sides of the shielding layer are higher than the lower surface of at least a part of the active layer, thus forming a semi-enclosed structure about the active layer. In this way, the shielding layer can shield the active layer both from below and from the sides, that is, it can not only block the light from below the shielding layer, but also can well block the light incident from the sides from irradiating the active layer. Thus, a single shielding layer can achieve an excellent shielding effect, avoiding the problem of leakage current caused by the active layer of the thin film transistor exposed to light, improving the working stability of the thin film transistor, and improving the display effect.

The groove may be formed by the shielding layer itself, for example, the thickness of a certain position of the shielding layer is thinner than that of other positions, thereby creating the groove. Of course, the groove may also be formed in other ways, for example, a film layer may be first deposited under the shielding layer, and the film layer may be first formed with a groove structure or a through-groove structure, and then the shielding layer is deposited to the shielding layer having a groove.

Figure 1:
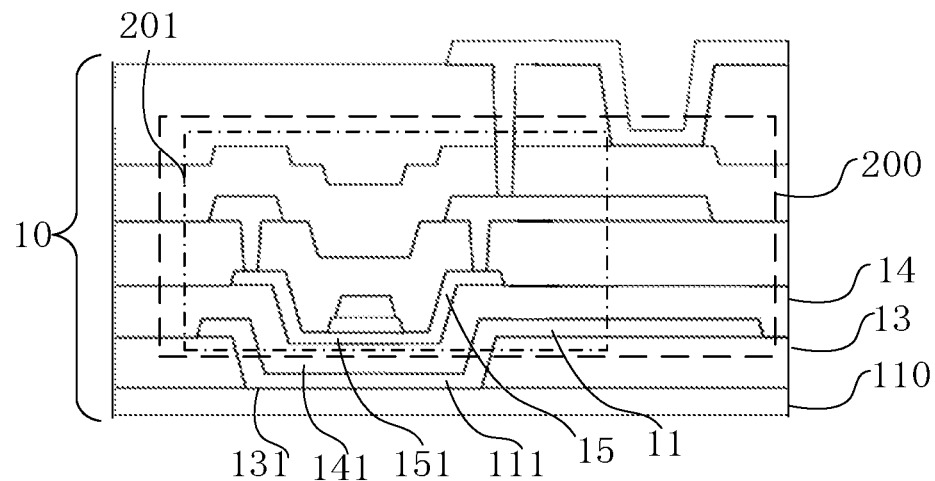
FIG. 1 is a schematic diagram of a first embodiment of an array substrate according to the present application.

In addition, the design of the shielding layer of the present application can be used in a liquid crystal display panel (LCD) or an organic light emitting diode display panel (OLED); it may be designed as a top gate electrode structure, or may also be designed as a bottom gate electrode structure. Hereinafter, the OLED and the top gate electrode structure are taken as an example, and the present application will be described in more detail with reference to the accompanying drawings:

FIG. 1 is a schematic diagram of a first embodiment of an array substrate according to the present application. As illustrated in FIG. 1, the array substrate 10 disclosed in this embodiment includes a base substrate 110 and a thin film transistor layer 200 arranged on the base substrate 110. The thin film transistor layer 200 includes an active layer. The shielding layer includes a first shielding layer 11. The thin film transistor layer 200 includes a driving thin film transistor 201, and the first shielding layer 11 is disposed corresponding to the driving thin film transistor 201. The groove includes a first groove 111 formed by the first shielding layer 11. The first groove 111 includes a groove bottom wall and two groove sidewalls. The two groove sidewalls are disposed on both sides of the groove bottom wall, and two ends of the groove bottom wall are respectively connected with the lower ends of the two groove sidewalls.

The active layer includes a first active layer 15, and the first active layer 15 is disposed in the driving thin film transistor 201. The first active layer 15 at least partially protrudes into the first groove 111, and the height of the upper end of each of the groove sidewalls is greater than the height of the lower surface of the first active layer 15 corresponding to the groove bottom wall.

Of course, the height of the upper end of the groove sidewalls may also be greater than the height of the upper surface of the portion of the first active layer 15 corresponding to the bottom of the first groove 111. Even when the width of the first active layer 15 is smaller than the width of the groove and so completely extends into the groove, the height of the upper end of the groove sidewalls may be higher than the height of the entire upper surface of the first active layer 15.

Optionally, as an improvement of the first embodiment, as shown in FIG. 1, in order to form the groove in a better and easier manner, the shielding layer can achieve the creation of the groove with the help of other film layers. In particular, the array substrate 10 may further include a first buffer layer 13, which is disposed between the base substrate 110 and the shielding layer. In particular, between the base substrate 110 and the first shielding layer 11, the first buffer layer 13 defines a first buffer groove 131, and the thickness of the first shielding layer 11 is smaller than the depth of the first buffer groove 131, and the first shielding layer 11 at least entirely covers the bottom wall and the sidewall of the first buffer groove 131 to form the above groove. The existence of the first buffer layer 13 and the first buffer groove 131 can facilitate deposition of the shielding layer to form a groove semi-surrounding the active layer. The first buffer groove 131 can be a groove structure in which the first buffer layer 13 is recessed but does not penetrated through, or can be a through groove structure that goes through the first buffer layer 13. If it is a groove structure, the depth of the first buffer groove 131 is shallow, which can reduce the risk of disconnection of the shielding layer and the film layers thereon. If it is a through-groove structure, the depth of the first buffer groove 131 is deeper, and so the depth of the formed groove is also deeper, which can better shield the active layer from the sides, so that the problem of leakage current caused by obliquely incident and refracted light entering the active layer from the sides can be improved.

When the shielding layer is made of a non-metal material such as a black matrix, then in this case the active layer can be directly formed on the shielding layer.

Of course, in order to reduce the intrusion of bad elements into the active layer, for example, the shielding layer adopts metal materials, such as molybdenum (Mo), titanium (Ti), silver (Ag), aluminum (Al), molybdenum copper (MoCu) alloy, molybdenum (Mo), titanium (Ti), silver (Ag), a laminated structure of molybdenum (Mo) and aluminum (Al)), etc., then as an improvement of the first embodiment, the array substrate 10 may further include a second buffer layer 14 disposed between the shielding layer and the thin film transistor layer 200. In particular, the second buffer layer 14 may be disposed between the first shielding layer 11 and the thin film transistor layer 200, and the second buffer layer 14 forms a second buffer groove 141 corresponding to the groove. In particular, the second buffer groove 141 is formed corresponding to the first groove 111.

The active layer covers the bottom and sidewalls of the second buffer groove 141 to form the active layer groove. The width of the active layer is smaller than the width of the shielding layer, and the total thickness of the active layer, the second buffer layer 14 and the shielding layer is smaller than the depth of the first buffer groove 131. When the shielding layer is made of a metal material, the second buffer layer 14 can prevent metal ions from diffusing into the active layer and affecting the stability of the active layer.

Specifically with regards to the position of the first shielding layer 11, the first active layer 15 covers the bottom wall and sidewalls of the second buffer groove 141 to form the active layer groove 151. The width of the first active layer 15 is smaller than the width of the first shielding layer 11, and the total thickness of the first active layer 15, the second buffer layer 14 and the first shielding layer 11 is smaller than the depth of the first buffer groove 131.

In addition, as a further improvement of this embodiment, it can also be considered that the groove walls of the first buffer groove 131 have a stepped shape. In this way, when the depth of the first buffer groove 131 is relatively deep, the risk of disconnection of the shielding layer and the film layers thereon can also be reduced. In addition, while the shielding layer forms a groove corresponding to the first buffer groove 131, the shielding layer itself can also be formed by a half-tone mask so that the film thickness at the position corresponding to the groove is thinner than the film thickness on both sides, so as to obtain a deeper concave groove to better form a semi-enclosed shielding structure for the active layer.

The thin film transistor layer 200 of the present application includes at least a driving thin film transistor 201, and the active layer of the driving thin film transistor 201 can be made of amorphous silicon, polysilicon, or indium zinc oxide or other materials. The following takes the top-gate electrode structure thin film transistor made of indium zinc oxide material as an example for description, see the following for particulars.

Figure 2:
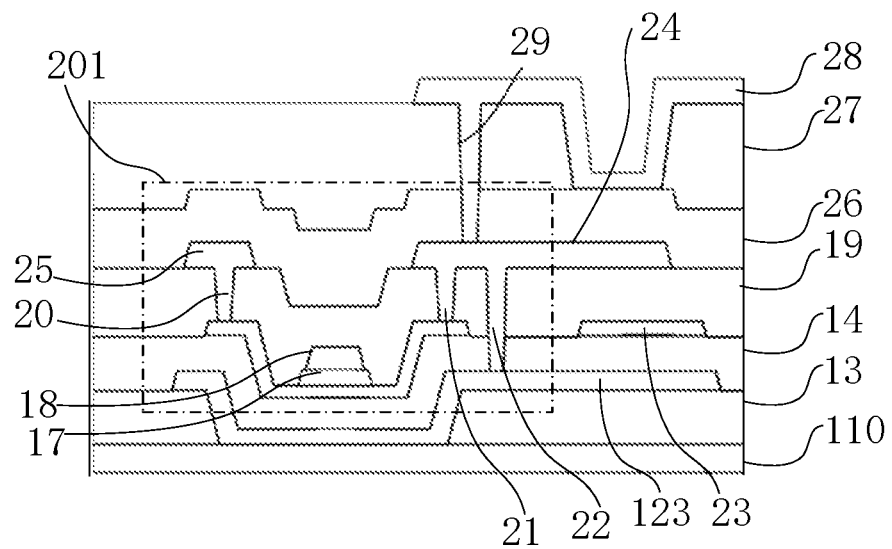
FIG. 2 is a schematic diagram of a second embodiment of an array substrate according to the present application.

FIG. 2 is a schematic diagram of a second embodiment of an array substrate according to the present application. As illustrated in FIG. 2, in conjunction with FIG. 1, the main differences between this embodiment and the first embodiment lie in the following: The thin film transistor layer 200 includes a driving thin film transistor 201, the driving thin film transistor 201 includes the first active layer 15, the first active layer 15 includes an indium gallium zinc oxide layer, and the driving thin film transistor 201 further includes: a gate insulating layer 17 disposed on the indium gallium zinc oxide layer; a gate electrode 18 disposed on the gate insulating layer 17; an intermediate dielectric layer 19 that is disposed on the gate electrode 18 and covers the second buffer layer 122, the indium gallium zinc oxide layer, the gate insulating layer 17 and the gate electrode 18, the intermediate dielectric layer 19 including a first via hole 20, a second via hole 21 and a third via hole 22; a source electrode 24 and a drain electrode 25 arranged on the intermediate dielectric layer 19, the drain electrode 25 being connected to the indium gallium zinc oxide layer through the first via hole 20, the source electrode 24 being connected to the indium gallium zinc oxide layer through the second via hole 21, and connected to the first shielding layer 11 through the third via hole 22; a passivation layer 26, disposed on the intermediate dielectric layer 19, where an anode via hole 29 is defined in the passivation layer 26; and a planarization layer 27 disposed on the passivation layer 26, where an anode 28 is disposed on the planarization layer 27 and is connected to the source electrode 24 through an anode via hole 29. The oxide active layer formed by indium gallium zinc oxide has superior flexibility and can also be used in the field of flexible display. In this embodiment, when indium gallium zinc oxide is used as the active layer, the output terminal of the thin film transistor is the source electrode, and the input terminal is the drain electrode, which is different from the general situation in which the source electrode is used as the input terminal and the drain electrode is used as the output terminal, which is a common sense known to those having ordinary skill in the art, and thus will not be detailed here.

The shielding layer includes a titanium metal layer, a titanium nitride layer or a stacked titanium metal layer and titanium nitride layer, that is, the shielding layer is made of a titanium metal material or a titanium nitride material. In this case, the shielding layer can not only block light, but also acts as an auxiliary gate electrode because the shielding layer is made of metal material and is connected to the source electrode, that is, a dual gate electrode structure is formed, in which the top gate electrode/active layer and the bottom gate electrode/active layer accumulate carriers at the same time, forming a top gate electrode channel and a bottom gate electrode channel, which can increase the carrier mobility, can have a larger gate electrode capacitance, and can control the surface potential of the channel more effectively, can suppress the generation of short channel effects, and is conducive to the production of small-sized devices and the realization of high resolution.

In addition, in the active layer, especially when indium gallium zinc oxide is used as the active layer, its carriers (electrons) are mainly generated through oxygen vacancies, and the intervention of hydrogen element will produce a series of chemical reactions, which will eventually occupy the oxygen vacancies and release more electrons, resulting in a higher carrier concentration of indium gallium zinc oxide and a negative bias in the threshold voltage, making the thin-film transistor easier to turn on. The source electrodes of hydrogen mainly include the following: in the backplate manufacturing process, hydrogen-containing materials such as silane (SiH4) are used, resulting in trace hydrogen residues in the film layer; hydrogen in organic materials; back-end packaging processes may use materials with high hydrogen content such as silicon nitride/silicon oxynitride. Since the molecular/atom/ion structure of hydrogen is tiny, it can usually diffuse and migrate in each film layer.

Therefore, taking titanium as an example, on the one hand, the crystal structure of titanium is a close-packed hexagonal system, which determines that the titanium film layer has the characteristics of high density and can block hydrogen permeation to a great extent. On the other hand, titanium has a good adsorption effect on hydrogen. Even if a small amount of hydrogen can enter the interior of titanium, it will be trapped in the lattice gap to form a Ti—H structure, so it is difficult for hydrogen to penetrate through the Ti film layer thus affecting TFT devices. Therefore, the shielding layer made of titanium metal material or titanium nitride material can block the lateral penetration of hydrogen into the active layer. Thin film transistors using indium gallium zinc oxide to form the active layer have extremely small leakage current. Using indium gallium zinc oxide as the active layer can effectively reduce the leakage current of the thin film transistor, thus improving the display quality of the display panel.

Both the first buffer layer 13 and the second buffer layer 14 may each include a SiOx layer, an AlO layer, or a stacked SiOx layer and AlOx layer, or may be made of silicon oxynitride (SiOxNy). Since neither SiOx nor AlOx contains hydrogen, the hydrogen content in the film can be further reduced. Of course, the active layer includes an indium zinc oxide layer, and at the same time, the shielding layer is made of titanium metal material or titanium nitride material, and the second buffer layer is made of silicon oxide (SiOx) material or aluminum oxide (AlO) material. Since the material of the shielding layer also does not contain hydrogen, a better effect of reducing hydrogen elements can be achieved.

In addition, as illustrated in FIG. 2, the thin film transistor layer 200 includes the source electrode 24, and the shielding layer may further include a groove extension 123, and the groove extension 123 is connected to the sidewall of the groove (for example, it can be connected to the sidewall of the first groove 111).

The array substrate 10 further includes a capacitor electrode layer 23 disposed above the second buffer layer 14, and the capacitor electrode layer 23 and the first active layer 15 are formed by a common process. The groove extending portion 123, the capacitor electrode layer 23 and the source electrode 24 at least partially overlap to form a storage capacitor. The source electrode can be the source electrode of the driving thin film transistor 201 or the switching source electrode of a switching thin film transistor. The three-layer structure of the shielding layer, the capacitor electrode layer and the source electrode forms the stacked capacitor electrode layer 23, which not only reduces the mask manufacturing process and improves the production efficiency, but also can use a smaller area to form a larger capacity capacitor thus increasing the capacitance, while increasing the aperture ratio of the product, which is more conducive to achieving high resolution.

Figure 3:
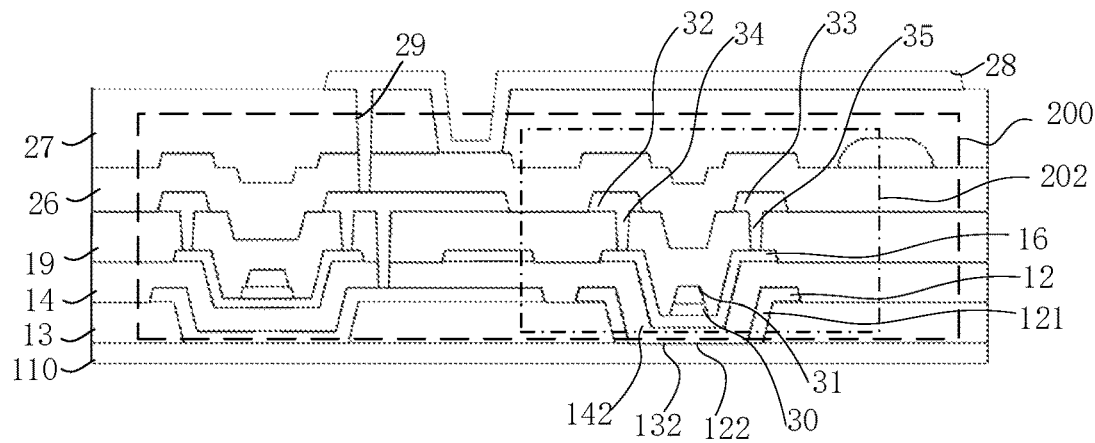
FIG. 3 is a schematic diagram of a third embodiment of an array substrate according to the present application.

FIG. 3 is a schematic diagram of a third embodiment of an array substrate according to the present application. As illustrated in FIG. 3, this embodiment is an improvement based on the first and second embodiments. In order to better realize the switching performance, in addition to the driving thin film transistor 201, other thin film transistors can be arranged on the array substrate 10, and the number of the other thin film transistors is not fixed. Hereinafter, the number of 1 is taken as an example for introduction, that is, the thin film transistor layer 200 further includes a switching thin film transistor 202, the shielding layer includes a second shielding layer 12, and the second shielding layer 12 is arranged corresponding to the switching thin film transistor 201. The groove includes a second groove 121 formed by the second shielding layer 12. The second groove 121 includes two second groove sidewalls, the two second groove sidewalls are spaced apart, and a hollow portion 122 is formed by hollowing out the portion between the two second groove sidewalls.

The active layer includes a second active layer 16, the second active layer 16 is located in the switching thin film transistor 202, and the second active layer 16 at least partially extends into the second groove 121, and the height of the upper end of the sidewalls of the second groove 121 is greater than the height of the lower surface of the portion of the second active layer 16 corresponding to the hollow portion 122. Similarly to the first embodiment, the switching thin film transistor 202 can also be provided with a first buffer layer, or a first buffer layer and a second buffer layer at the same time. The specific structures thereof can be understood with reference to the first embodiment and will not be repeated here.

Two different thin film transistors can meet different driving requirements according to different combinations. For example, taking OLED as an example, the driving thin film transistor 201 and the switching thin film transistor 202 can be designed to perform their respective shares of operations to achieve the required charging effects.

In order to save the process and improve the production effect, the driving thin film transistor 201 and the switching thin film transistor 202 can be formed by a common process, as follows:

As illustrated in FIG. 3, the switching thin film transistor 202 and the driving thin film transistor 201 are formed by a common process, where the common process here means that at least a part of the film layers of the switching thin film transistor 202 and a part of the film layer of the driving thin film transistors 201 are formed by a common process. The switching thin film transistor 202 includes a second active layer 16, a switching insulating layer 30, a switching gate electrode 31, a switching source electrode 32 and a switching drain electrode 33. The second active layer 16 includes a switch indium gallium zinc oxide layer. The switching indium gallium zinc oxide layer is disposed on the second buffer layer 14, and where the switching indium gallium zinc oxide layer and the indium gallium zinc oxide layer are formed by a common process. The switch insulating layer 30 is arranged on the switch indium gallium zinc oxide layer, and the switch insulating layer 30 and the gate insulating layer 17 are disposed in the same layer. The switch gate electrode 31 is formed on the switch insulating layer 30, and the switch gate electrode 31 and the gate electrode 18 are formed by a common process. The switch source electrode 32 and the switch drain electrode 33 are oppositely disposed on the intermediate dielectric layer 19. The intermediate dielectric layer 19 further includes a fourth via hole 34 and a fifth via hole 35. The switch source electrode 32 is connected to the switch indium gallium zinc oxide layer through the fourth via hole 34. The switch drain electrode 33 is connected to the switch indium gallium zinc oxide layer through the fifth via hole 35. The first buffer layer 13 further includes a first switch buffer groove 132, and the switching thin film transistor 202 is disposed corresponding to the first switch buffer groove 132. Between the first buffer layer 121 and the second buffer layer 122, a second shielding layer 12 is disposed corresponding to the first switch buffer groove 132. The second shielding layer 12 and the first shielding layer 11 are formed by a common process. A second switch buffer groove 142 is disposed on the second buffer layer 13, and the second switch buffer groove 142 is disposed corresponding to the first switch buffer groove 132.

The switching gate electrode 31 of the switching thin film transistor 202 is connected to the scan line (SL), the switching drain electrode 33 is connected to the data line (DL), and the switching source electrode 32 is connected to the gate electrode 18 of the driving thin film transistor 201. The drain electrode 25 of the driving thin film transistor 201 is connected to the reference voltage terminal, so that the switching thin film transistor 202 can adjust the anode voltage by controlling the voltage at the gate electrode of the driving thin film transistor 201.

Figure 4:
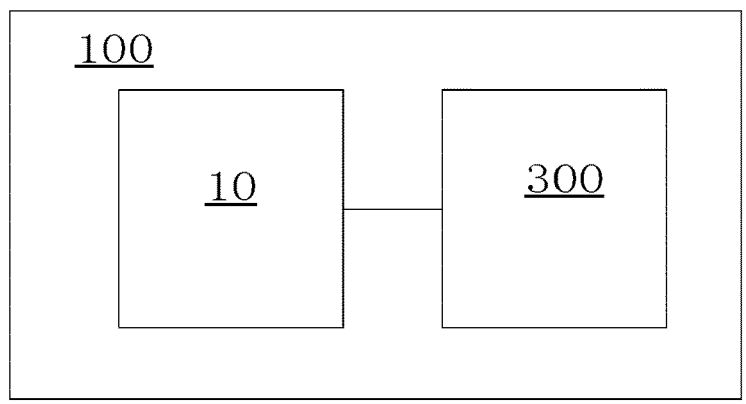
FIG. 4 is a schematic diagram of a display panel according to an embodiment according to the present application.

FIG. 4 is a schematic diagram of a display panel according to an embodiment of the present application. As illustrated in FIG. 4, the present application further discloses a display panel, comprising an array substrate 10 and a printed circuit board 300. The printed circuit board 300 is bound and connected to the array substrate 10, and the array substrate 10 adopts any one of the array substrates 10 disclosed in this application.

When the display panel 100 is a liquid crystal display panel, the display panel 100 further includes a color filter substrate disposed opposite to the array substrate 10 and a liquid crystal layer disposed between the array substrate 10 and the color filter substrate. When the display panel 100 is an organic light emitting diode display panel, the display panel further includes a light emitting device layer disposed on the array substrate 10. The light-emitting device layer is deposited by an inkjet printing or evaporation process. The light-emitting device layer includes an anode, a hole injection layer, a hole transport layer, a light-emitting layer, an electron transport layer, and an electron injection layer that are stacked in sequence. The light-emitting layer includes a red light-emitting layer, a green light-emitting layer, and a blue light-emitting layer.

Figure 5:
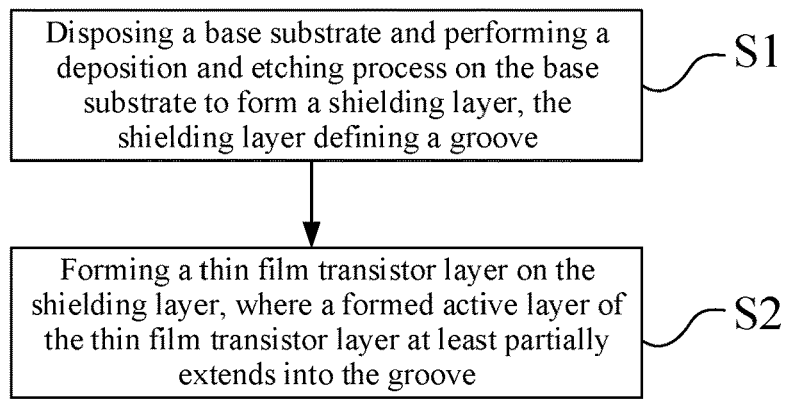
FIG. 5 is a schematic diagram of a first embodiment of a method of manufacturing an array substrate according to the present application.

FIG. 5 is a schematic diagram of a first embodiment of a method of manufacturing an array substrate according to the present application. As illustrated in FIG. 5, the present application further discloses a method of manufacturing an array substrate, which is used to manufacture any one of the array substrates disclosed in the present application, and the method includes the following operations:

S1: disposing a base substrate, performing a deposition and etching process on the base substrate to form a shielding layer, the shielding layer defining a groove;

S2: forming a thin film transistor layer on the shielding layer, where a formed active layer of the thin film transistor layer at least partially extends into the groove. The groove may be realized by adjusting the film thickness of the shielding layer itself, or it may be realized by other film layers.

Figure 6:
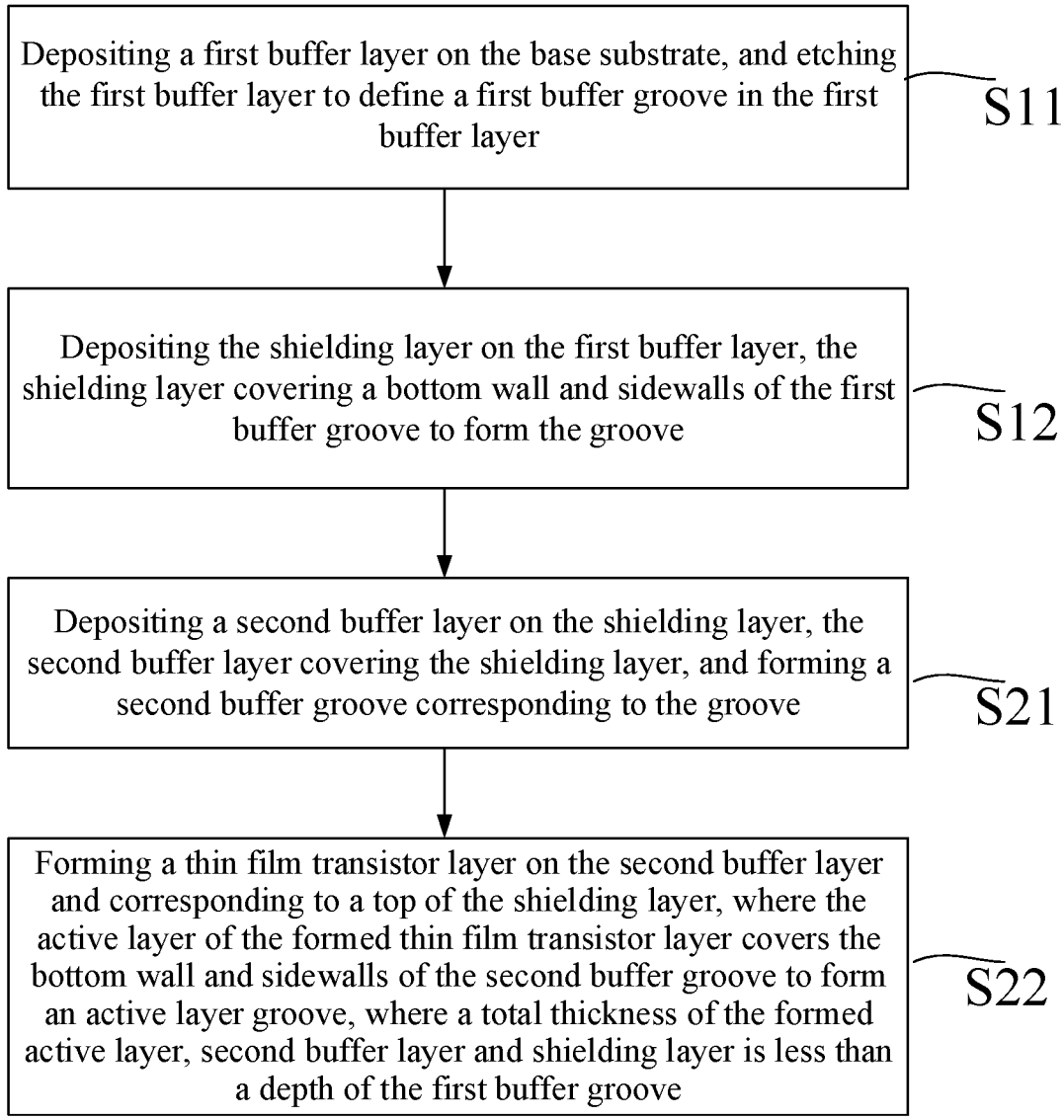
FIG. 6 is a schematic diagram of a second embodiment of a method for manufacturing an array substrate according to the present application.

FIG. 6 is a schematic diagram of a second embodiment of a method of manufacturing an array substrate according to the present application. As illustrated in FIG. 6, for example, a base substrate is provided, and the shielding layer is formed by performing a deposition and etching process on the base substrate, and the step S1 of forming the groove in the shielding layer includes:

S11: depositing a first buffer layer on the base substrate, and etching a first buffer groove in the first buffer layer;

S12: depositing the shielding layer on the first buffer layer, the shielding layer covering the bottom wall and the sidewalls of the first buffer groove to form the groove;

The step S2 of forming the thin film transistor layer on the shielding layer, where the active layer of the thin film transistor layer at least partially extends into the groove includes:

S21: depositing a second buffer layer on the shielding layer, the second buffer layer covering the shielding layer, and forming a second buffer groove in the corresponding groove;

S22: forming the thin film transistor layer on the second buffer layer and corresponding to the top of the shielding layer, and the active layer of the formed thin film transistor layer covers the bottom wall of the second buffer groove and sidewalls to form an active layer groove, and the total thickness of the formed active layer, second buffer layer and shielding layer is less than the depth of the first buffer groove.

When the second buffer layer is not required, this step S21 can also be omitted, for example, when the shielding layer is made of non-metal materials such as a black matrix. Additionally, in addition to the first buffer layer assisting the formation of the groove, it can also be achieved by simultaneously controlling the film thickness of the shielding layer and other film layers. That is, the shielding layer forms a groove corresponding to the position of the first buffer groove, and corresponding to the position of the groove, the thickness of the shielding layer is thinner than that of other positions, thereby obtaining a deeper groove.

Figure 7:
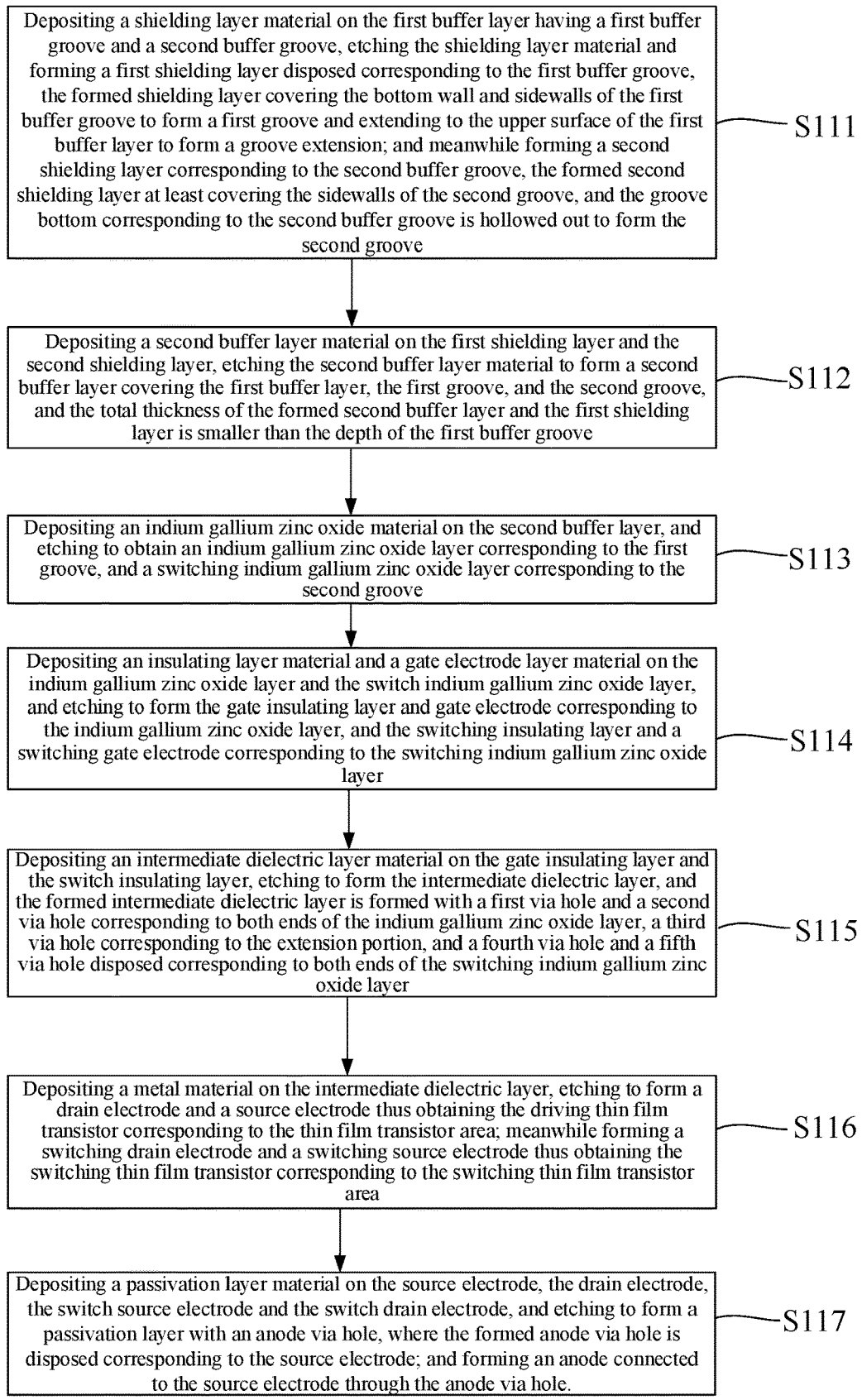
FIG. 7 is a schematic diagram of a third embodiment of a method for manufacturing an array substrate according to the present application.
Figure 10:
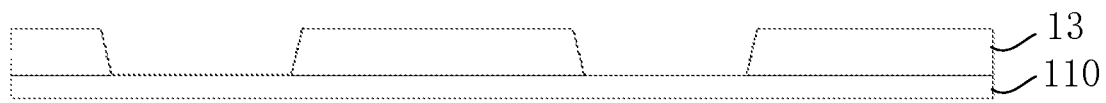
FIG. 10 is a schematic diagram illustrating a third stage of changes of film layers in a manufacturing process of an array substrate according to an embodiment of the present application.

FIG. 7 is a schematic diagram of a third embodiment of a method of manufacturing an array substrate according to the present application. As illustrated in FIG. 7, the present application further discloses a method of manufacturing an array substrate, where the array substrate is divided into a driving thin film transistor area and a switching thin film transistor area, the method including the following steps:

S111: depositing a shielding layer material on the first buffer layer having the first buffer groove and the second buffer groove, etching the shielding layer material, forming a first shielding layer disposed corresponding to the first buffer groove, the formed shielding layer covering the bottom wall and sidewalls of the first buffer groove to form a first groove and extending to the upper surface of the first buffer layer to form a groove extension; and meanwhile forming a second shielding layer corresponding to the second buffer groove, the formed second shielding layer at least covering the sidewalls of the second groove, and the groove bottom corresponding to the second buffer groove is hollowed out to form the second groove;

S112: depositing a second buffer layer material on the first shielding layer and the second shielding layer, etching the second buffer layer material to form a second buffer layer covering the first buffer layer, the first groove, and the second groove, and the total thickness of the formed second buffer layer and the first shielding layer is smaller than the depth of the first buffer groove, that is, the height of the upper ends of the sidewalls of the first groove and the second groove, is greater than the height of the upper surface of the second buffer layer at the positions corresponding to the first groove and the second groove;

S113: depositing an indium gallium zinc oxide material on the second buffer layer, and etching to obtain an indium gallium zinc oxide layer corresponding to the first groove, and a switching indium gallium zinc oxide layer corresponding to the second groove;

S114: depositing an insulating layer material and a gate electrode layer material on the indium gallium zinc oxide layer and the switch indium gallium zinc oxide layer, and etching to form the gate insulating layer and gate electrode corresponding to the indium gallium zinc oxide layer, and the switching insulating layer and a switching gate electrode corresponding to the switching indium gallium zinc oxide layer;

S115: depositing an intermediate dielectric layer material on the gate insulating layer and the switch insulating layer, etching to form the intermediate dielectric layer, and the formed intermediate dielectric layer is formed with a first via hole and a second via hole corresponding to both ends of the indium gallium zinc oxide layer, a third via hole corresponding to the extension portion, and a fourth via hole and a fifth via hole disposed corresponding to both ends of the switching indium gallium zinc oxide layer;

S116: depositing a metal material on the intermediate dielectric layer, etching to form a drain electrode connected to the indium gallium zinc oxide layer through a first via hole, and a source electrode that is connected to the indium gallium zinc oxide through the second via hole, and connected to extension portion through the third via hole, thus obtaining the driving thin film transistor corresponding to the thin film transistor area; meanwhile forming a switching drain electrode connected to the switching indium gallium zinc oxide layer through the fourth via hole, and a switching source electrode connected to the switch indium gallium zinc oxide layer through the fifth via hole to obtaining the switching thin film transistor corresponding to the switching thin film transistor area;

S117: depositing a passivation layer material on the source electrode, the drain electrode, the switch source electrode and the switch drain electrode, and etching to form a passivation layer with an anode via hole, where the formed anode via hole is disposed corresponding to the source electrode; and forming an anode connected to the source electrode through the anode via hole. The main difference between this embodiment and the embodiment illustrated in FIG. 10 is that not only the thin film transistor and the switching thin film transistor are formed by a common process, but the storage capacitor is also formed by a common process. The above-mentioned buffer groove may be a non-hollow groove structure or a hollow through-groove structure, which is determined as required.

Figure 8:
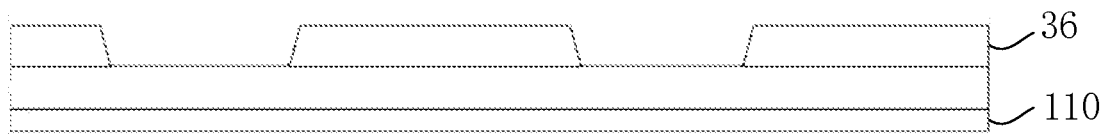
FIG. 8 is a schematic diagram illustrating a first stage of changes of film layers in a manufacturing process of an array substrate according to an embodiment of the present application.

Corresponding to the third embodiment of the method of manufacturing the array substrate, FIGS. 8-21 show the whole process of manufacturing the improved driving thin film transistor and switching thin film transistor of the present application on the array substrate by showing the schematic diagram of the changes of the film layers during the manufacturing process, in particular:

FIG. 8 is a schematic diagram illustrating a first stage of changes of the film layers during the manufacturing process of the array substrate according to an embodiment of the present application. As illustrated in FIG. 8, there is shown a schematic diagram of film layers illustrating the deposition of the first buffer layer material and the formation of the photoresist 36 on the base substrate 110.

Figure 9:
FIG. 9 is a schematic diagram illustrating a second stage of changes of film layers in a manufacturing process of an array substrate according to an embodiment of the present application.

FIG. 9 is a schematic diagram illustrating a second stage of film layer changes in the manufacturing process of the array substrate according to an embodiment of the present application. As illustrated in FIG. 9, there is shown a film layer structural diagram of the first buffer layer 13 obtained by etching the first buffer layer material.

FIG. 10 is a schematic diagram illustrating a third stage of the film layer changes during the manufacturing process of the array substrate according to an the embodiment of the present application. As illustrated in FIG. 10, there is shown a film layer structural diagram after peeling off the photoresist 36 located on the first buffer layer 13.

Figure 11:
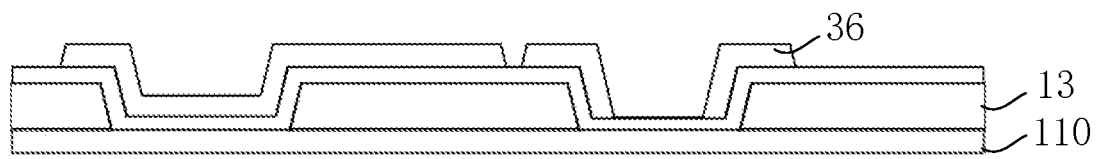
FIG. 11 is a schematic diagram illustrating a fourth stage of changes of film layers in a manufacturing process of an array substrate according to an embodiment of the present application.

FIG. 11 is a schematic diagram illustrating a fourth stage of film layer changes during the manufacturing process of the array substrate according to an embodiment of the present application. As illustrated in FIG. 11, there is shown a film layer structural diagram of a shielding layer material and a photoresist 36 deposited over the first buffer layer.

Figure 12:
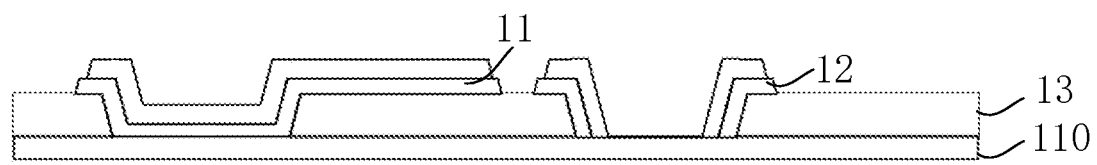
FIG. 12 is a schematic diagram illustrating a fifth stage of changes of film layers in a manufacturing process of an array substrate according to an embodiment of the present application.

FIG. 12 is a schematic diagram illustrating a fifth stage of the film layer changes in the manufacturing process of an array substrate according to an embodiment of the present application. As illustrated in FIG. 12, there is shown a film layer structural diagram after etching the shielding layer material to form the first shielding layer 11 and the second shielding layer 12.

Figure 13:
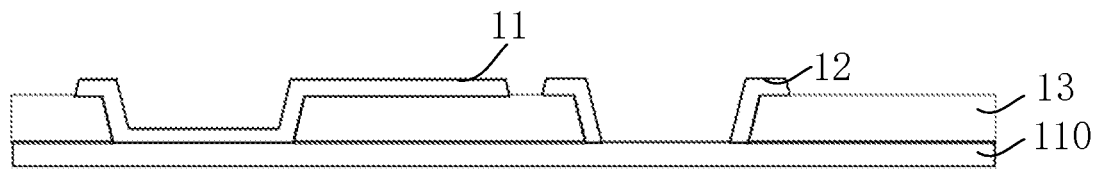
FIG. 13 is a schematic diagram illustrating a sixth stage of changes of film layers in a manufacturing process of an array substrate according to an embodiment of the present application.

FIG. 13 is a schematic diagram illustrating a sixth stage of the film layer changes in the manufacturing process of the array substrate according to an embodiment of the present application. As illustrated in FIG. 13, there is shown the film layer structural diagram after peeling off the photoresist above the first shielding layer 11 and the second shielding layer 12, which corresponds to the film layer structure after step S111 is performed.

Figure 14:
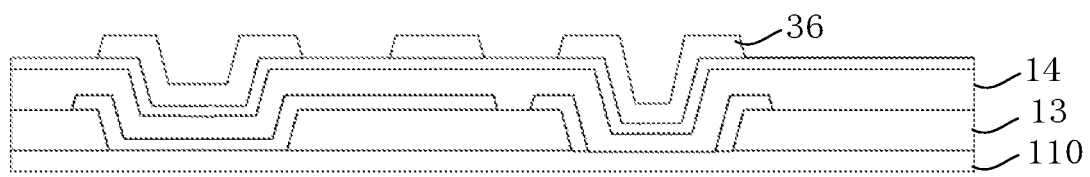
FIG. 14 is a schematic diagram illustrating a seventh stage of changes of film layers in a manufacturing process of an array substrate according to an embodiment of the present application.

FIG. 14 is a schematic diagram illustrating a seventh stage of the film layer changes in the manufacturing process of the array substrate according to an embodiment of the present application. As illustrated in FIG. 14, there is shown the film layer structural diagram after depositing the second buffer layer material and the active layer material on the first shielding layer 11 and the second shielding layer 12, and forming the photoresist 36 above the active layer material, which corresponding to the film layer structure after step S112 is performed.

Figure 15:
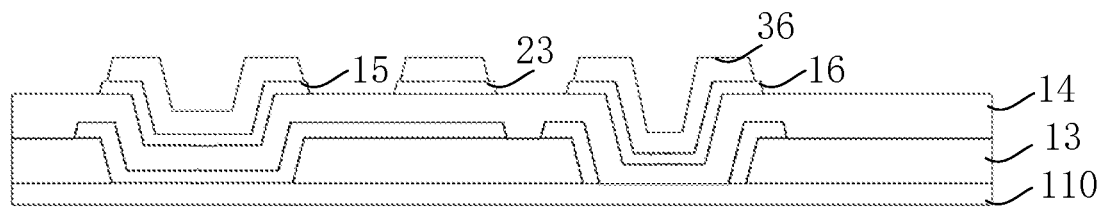
FIG. 15 is a schematic diagram illustrating an eighth stage of changes of film layers in a manufacturing process of an array substrate according to an embodiment of the present application.

FIG. 15 is a schematic diagram of illustrating an eighth stage of the film layer changes in the manufacturing process of the array substrate according to an embodiment of the present application. As illustrated in FIG. 15, there is shown the film layer structural diagram after etching the active layer material to obtain the first active layer 15, the second active layer 16 and the capacitor electrode layer 23.

Figure 16:
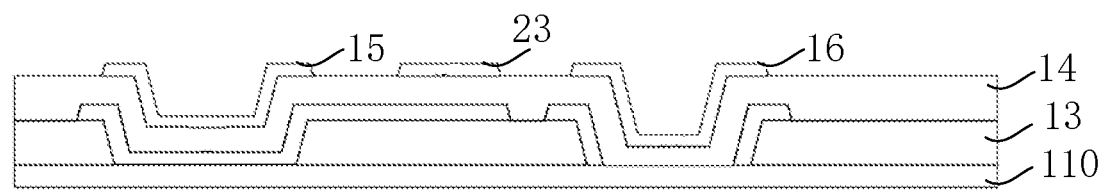
FIG. 16 is a schematic diagram illustrating a ninth stage of changes of film layers in a manufacturing process of an array substrate according to an embodiment of the present application.

FIG. 16 is a schematic diagram illustrating a ninth stage of the film layer changes during the manufacturing process of the array substrate according to an embodiment of the present application. As illustrated in FIG. 16, there is shown the film layer structural diagram after stripping the photoresist above the first active layer 15, the second active layer 16 and the capacitor electrode layer 23, which corresponds to the film layer structure after step S113 is performed.

Figure 17:
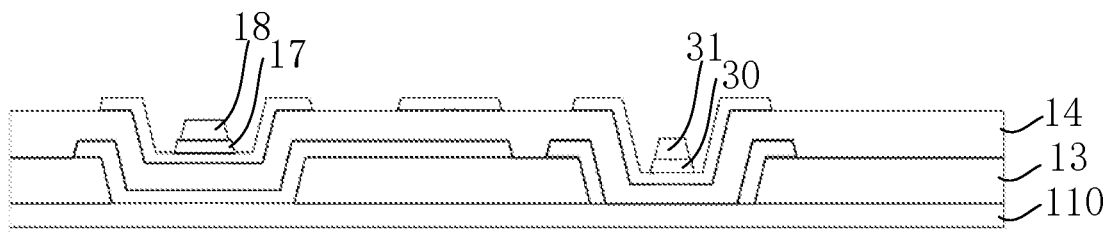
FIG. 17 is a schematic diagram illustrating a tenth stage of changes of film layers in a manufacturing process of an array substrate according to an embodiment of the present application.

FIG. 17 is a schematic diagram illustrating a tenth stage of the film layer changes during the manufacturing process of the array substrate according to an embodiment of the present application. As illustrated in FIG. 17, there is shown the film layer structure after forming the gate insulating layer 17 and the gate electrode 18 on the first active layer 15 and after forming the switching insulating layer 30 and the switching gate electrode 31 over the second active layer 16, which corresponds to the film layer structure after step S114 is performed.

Figure 18:
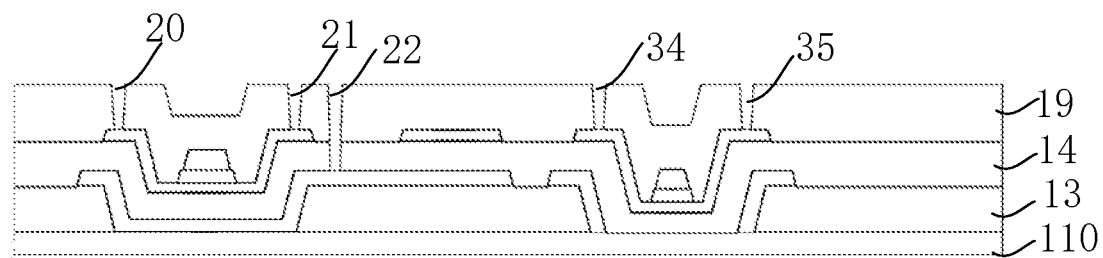
FIG. 18 is a schematic diagram illustrating an eleventh stage of changes of film layers in a manufacturing process of an array substrate according to an embodiment of the present application.

FIG. 18 is a schematic diagram illustrating an eleventh stage of the film layer changes during the manufacturing process of the array substrate according to an embodiment of the present application. As illustrated in FIG. 18, there is shown the film layer structural diagram after the formation of the intermediate dielectric layer 19 having the first via hole 20, the second via hole 21, the third via hole 22, the fourth via hole 34 and the fifth via hole 35, corresponding to the film layer structure after step S115 is performed.

Figure 19:
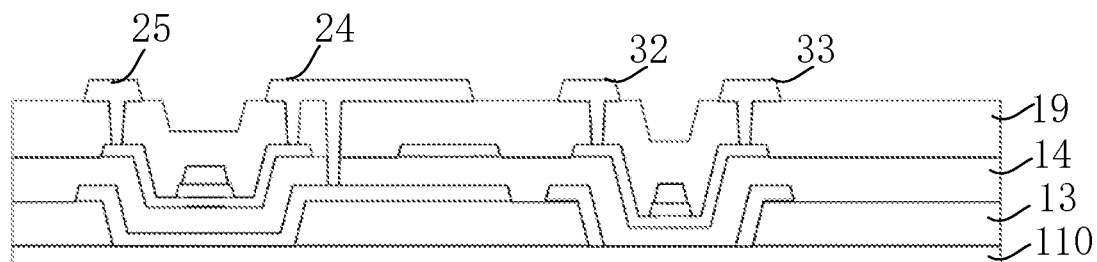
FIG. 19 is a schematic diagram illustrating a twelfth stage of changes of film layers in a manufacturing process of an array substrate according to an embodiment of the present application.

FIG. 19 is a schematic diagram illustrating a twelfth stage of film layer changes during the manufacturing of the array substrate according to an embodiment of the present application. As illustrated in FIG. 19, there is shown the film layer structural diagram after forming the source electrode 24 and the drain electrode 25 corresponding to the positions of the first via hole 20, the second via hole 21, the fourth via hole 34 and the fifth via hole 35, and forming the switch source electrode 32 and the switch drain electrode 33, corresponding to the film layer structure after step S116 is performed.

Figure 20:
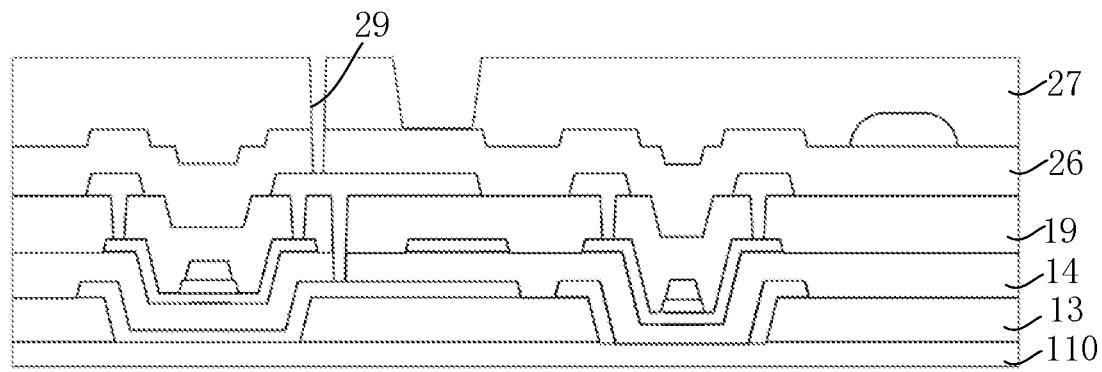
FIG. 20 is a schematic diagram illustrating a thirteenth stage of changes of film layers in a manufacturing process of an array substrate according to an embodiment of the present application.

FIG. 20 is a schematic diagram illustrating a thirteenth stage of the film layer changes during the manufacturing process of the array substrate according to an embodiment of the present application. As illustrated in FIG. 20, there is shown a film layer structural diagram after forming a passivation layer 26 and a planarization layer 27 over the source electrode and drain electrodes, and forming an anode via 29 on the planarization layer 27.

Figure 21:
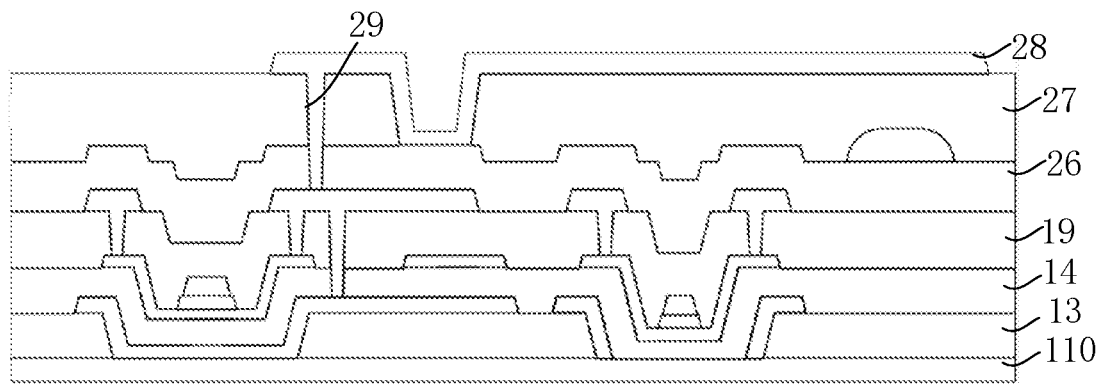
FIG. 21 is a schematic diagram illustrating a final stage of changes of film layers in a manufacturing process of an array substrate according to an embodiment of the present application.

FIG. 21 is a schematic diagram illustrating a final stage of the film layer changes in the manufacturing process of the array substrate according to an embodiment of the present application. As illustrated in FIG. 21, there is shown the film layer structural diagram after the anode 28 is formed corresponding to the position of the anode via hole, which corresponds to the film layer structure after step S117 is performed. So far, the production of the driving thin film transistor and the switching thin film transistor has been completed. Of course, film layers such as a pixel definition layer can also be formed on the anode, but this is not the main invention point of the present application, so it will not be repeated. Of course, the structures of the driving thin film transistors and the switching thin film transistors shown in FIGS. 8-21 are only examples, rather than limitations, and other driving structures may also be used for the driving thin film transistors and the switching thin film transistors. The first shielding layer 11 and the second shielding layer 12 are formed in the same layer, where a predetermined pattern of photoresist 36 is formed by sharing a masking process, and then they are formed by a common etching process. Similarly, the first active layer 15, the capacitor electrode layer 23 and the second active layer 16 are also in the same layer, and so on and so forth, the gate electrode, source electrode and drain electrode layers, gate insulating layers and other film layers can also be formed sharing the same process.

It should be noted that the description of various steps involved in this solution are not to be construed as limiting the order of steps, if the implementation of the specific solution is not affected. That is, the steps written in earlier can be performed before, or after, or even at the same time as those written later. As long as this solution can be implemented, any order of the steps should be regarded as falling the scope of protection of this application.

It should be noted that the inventive concept of the present application can form a large number of embodiments, but they cannot be enumerated because the length of the application document is limited. The technical features as set forth herein can be arbitrarily combined to form a new embodiment, and the original technical effects may be enhanced after various embodiments or technical features are combined.

The foregoing is a further detailed description of the present application in conjunction with specific optional embodiments, but it should not be construed as that the specific implementation of the present application will be limited to these descriptions. For those having ordinary skill in the technical field of the present application, without departing from the scope and spirit of the present application, some simple deductions or substitutions can be made, which should all be regarded as falling in the scope of protection of the present application.

What is claimed is:

1. An array substrate comprising a base substrate and a thin film transistor layer disposed on the base substrate; the thin film transistor layer comprises an active layer; the array substrate further comprises a shielding layer arranged between the base substrate and the thin film transistor layer, the shielding layer defining a groove, and the active layer at least partially extending into the groove;
wherein the thin film transistor layer comprises a driving thin film transistor, and the shielding layer comprises a first shielding layer disposed corresponding to the driving thin film transistor; the groove comprises a first groove formed by the first shielding layer, the first groove comprising a groove bottom wall and two groove sidewalls that are disposed on both sides of the groove bottom wall, and wherein two ends of the groove bottom wall are respectively connected with lower ends of the two groove sidewalls; wherein the active layer comprises a first active layer that is disposed in the driving thin film transistor, and that at least partially extends into the first groove;
wherein the thin film transistor layer further comprises a switching thin film transistor, and the shielding layer further comprises a second shielding layer disposed corresponding to the switching thin film transistor; the groove further comprises a second groove formed by the second shielding layer, the second groove comprising two second groove sidewalls that are spaced apart, the second shielding layer comprises a hollow portion, the hollow portion disposed between the two second groove sidewalls;
wherein the active layer comprises a second active layer that is disposed in the switching thin film transistor and that at least partially extends into the second groove.

2. The array substrate of claim 1, further comprising a first buffer layer arranged between the base substrate and the shielding layer, wherein the first buffer layer forms a first buffer groove, and wherein a thickness of the shielding layer is less than a depth of the first buffer groove, and the shielding layer at least covers a bottom wall and sidewalls of the first buffer groove to form the groove.

3. The array substrate of claim 1, wherein the array substrate further comprises a first buffer layer arranged between the base substrate and the shielding layer, wherein the first buffer layer forms a first buffer groove, and wherein a thickness of the shielding layer is less than a depth of the first buffer groove, and the shielding layer at least covers a bottom wall and sidewalls of the first buffer groove to form the groove.

4. The array substrate of claim 1, wherein the array substrate further comprises a first buffer layer arranged between the base substrate and the shielding layer, wherein the first buffer layer forms a first buffer groove, and wherein a thickness of the shielding layer is less than a depth of the first buffer groove, and wherein the shielding layer at least covers a bottom wall and sidewalls of the first buffer groove to form the groove.

5. The array substrate of claim 2, wherein the array substrate further comprises a second buffer layer arranged between the shielding layer and the thin film transistor layer; the second buffer layer forms a second buffer groove corresponding to the groove;
  wherein the active layer covers a bottom wall and sidewalls of the second buffer groove to form an active layer groove.

6. The array substrate of claim 5, wherein the active layer comprises an indium zinc oxide layer, the shielding layer is made of a titanium metal material or a titanium nitride material, and wherein the second buffer layer is made of a silicon oxide material or an alumina material.

7. The array substrate of claim 5, wherein the thin film transistor layer comprises a source electrode, and the shielding layer further comprises a groove extension portion connected to a sidewall of the groove;
  wherein the array substrate further comprises a capacitor electrode layer disposed above the second buffer layer, and wherein the groove extension portion, the capacitor electrode layer and the source electrode all at least partially overlap to form a storage capacitor.

8. The array substrate of claim 1, wherein the driving thin film transistor further comprises:
  a gate insulating layer disposed on the active layer;
  a gate electrode arranged on the gate insulating layer;
  an intermediate dielectric layer arranged on the gate electrode and covering the second buffer layer, the active layer, the gate insulating layer and the gate electrode; the intermediate dielectric layer comprises a first via hole, a second via hole and a third via hole; and
  a source electrode and a drain electrode arranged on the intermediate dielectric layer, wherein the drain electrode is connected to the active layer through the first via hole; the source electrode is connected to the active layer through the second via hole, and is connected to the first shielding layer through the third via hole.

9. The array substrate of claim 1, wherein the shielding layer comprises a titanium metal layer, a titanium nitride layer, or a stack of a titanium metal layer and a titanium nitride layer.

10. A display panel comprising an array substrate and a printed circuit board bound and connected to the array substrate, wherein the array substrate comprises a base substrate and a thin film transistor layer arranged on the base substrate; the thin film transistor layer comprises an active layer; the array substrate further comprises a shielding layer disposed between the base substrate and the thin film transistor layer, the shielding layer defining a groove, and the active layer at least partially extending into the groove;
  wherein the thin film transistor layer comprises a driving thin film transistor, and the shielding layer comprises a first shielding layer disposed corresponding to the driving thin film transistor; the groove comprises a first groove formed by the first shielding layer, the first groove comprising a groove bottom wall and two groove sidewalls that are disposed on both sides of the groove bottom wall, and wherein two ends of the groove bottom wall are respectively connected with lower ends of the two groove sidewalls; wherein the active layer comprises a first active layer that is disposed in the driving thin film transistor, and that at least partially extends into the first groove;
  wherein the thin film transistor layer further comprises a switching thin film transistor, and the shielding layer further comprises a second shielding layer disposed corresponding to the switching thin film transistor; the groove further comprises a second groove formed by the second shielding layer, the second groove comprising two second groove sidewalls that are spaced apart, the second shielding layer comprises a hollow portion, the hollow portion disposed between the two second groove sidewalls;
  wherein the active layer comprises a second active layer that is disposed in the switching thin film transistor and that at least partially extends into the second groove.

11. The display panel of claim 10, further comprising a light emitting device layer disposed on the array substrate, the light emitting device layer being formed by an inkjet printing or deposition process and comprising an anode, a hole injection layer, a hole transport layer, a light-emitting layer, an electron transport layer, and an electron injection layer that are stacked in sequence, and wherein the light-emitting layer comprises a red light-emitting layer, a green light-emitting layer, and a blue light-emitting layer.

12. The array substrate of claim 1, wherein a height of the upper end of the sidewalls of the second groove is greater than a height of the lower surface of the portion of the second active layer corresponding to the hollow portion.

13. The array substrate of claim 5, wherein a height of the upper surface of the portion of second buffer layer corresponding to the first groove is greater than a height of the upper surface of the portion of second buffer layer corresponding to the hollow portion.

* * * * *